METHOD OF MAKING AN INSULATED GATE SEMICONDUCTOR DEVICE

Filed June 7, 1967

INVENTORS
NOBUO KAWAMURA
TAKEO OHYACHI
BY
Hopgood & Calimafde
ATTORNEYS

United States Patent Office 3,491,433
Patented Jan. 27, 1970

3,491,433
METHOD OF MAKING AN INSULATED GATE SEMICONDUCTOR DEVICE

Nobuo Kawamura and Takeo Ohyachi, Tokyo, Japan, assignors to Nippon Electric Company, Limited, a company of Japan Filed June 7, 1967, Ser. No. 644,149
Claims priority, application Japan, June 8, 1966, 41/36,970
Int. Cl. H01g 13/00
U.S. Cl. 29—570 1 Claim

ABSTRACT OF THE DISCLOSURE

A chemically stable oxide layer is added to a basic semiconductor structure which includes a substrate, an oxide insulating layer thereon and a metallic electrode, the added layer being interposed between the oxide insulative layer and the metallic electrode, whereby operating performance is improved.

Background of the invention

The basic structure of insulated gate semiconductor devices (hereinafter referred to as MOS semiconductor devices) such as the MOS transistor and the MOS diode, consists generally of a semiconductor substrate, an oxide insulating layer on the surface of the substrate, and a metal electrode formed on the surface of the oxide layer.

It has been common practice with such an MOS structure to use a silicon wafer as the semiconductor substrate, a silicon dioxide film formed by thermal oxidation of the silicon wafer as the oxide layer, and vacuum-evaporated aluminum on the silicon dioxide film as the metal electrode.

A serious drawback of conventional MOS semiconductor devices having such a structure is that the surface potential of the semiconductor wafer is adversely affected by what is commonly called the bias temperature treatment. This treatment is one during which the fabricated semiconductor device is heated to a temperature of the order of 200 degrees centigrade with a DC voltage applied across the metal electrode and the silicon single crystal. As a result of the adverse effect of this treatment on the surface potential of the wafer, the actual performance of the MOS device deviates appreciably from the expected or anticipated performance. This phenomenon is much more pronounced when the polarity of the metal electrode is maintained positive than when maintained negative during the application of this DC voltage.

The probable causes that have been generally believed responsible for the surface potential being affected by the bias temperature treatment are as follows: (a) One probable cause is the creation of oxygen ion vacancies in the silicon oxide layer due to the reaction between the silicon dioxide and the metal and the movement of the oxygen-ion vacancies which have been positively charged in the silicon dioxide layer by application of the DC voltage. (b) Another probable cause is the contamination of the device samples due to exposure to the atmosphere during the time interval between the growth of the silicon dioxide layer and the evaporation of the metal electrode.

Objects of the invention

The principal object of this invention is to provide an MOS type semiconductor device which has the feature of stabilized performance despite the bias temperature treatment referred to above.

Another object of the invention is to provide a new and improved type of MOS semiconductor device having actual performance characteristics more closely resembling the anticipated performance characteristics.

All of the objects, features and advantages of this invention and the manner of attaining them will become more apparent and the invention itself will be best understood by reference to the following description of the invention taken in conjunction with the accompanying drawing.

General summary of the invention

Briefly, in accordance with the invention, a chemically stable tantalum oxide layer is interposed in the MOS device structure between the metal electrode and a first oxide layer, such as for example silicon dioxide. This tantalum oxide layer can be formed on the silicon dioxide layer in the following manner. As a first step, the silicon dioxide layer is grown on a silicon semiconductor crystal wafer by the thermal oxidation method or by utilizing oxygen ions in an oxygen plasma. The Si-$SiO_2$ system is then held in a glow discharge condition in an oxygen gas atmosphere and the surface of the cathode, which is made of tantalum, is bombarded with oxygen ions so that reactive sputtering may occur. This is followed by the formation of a metal electrode on the tantalum oxide layer to complete the MOS structure.

Because of the chemically stable tantalum oxide layer provided between the metal electrode and the oxide layer according to this invention, the possibility of occurrence of unwanted phenomenon or creation of oxygen-ion vacancies that would otherwise take place by chemical reaction between the metal and the oxide layer, is eliminated. As a result, the electrical performance of the MOS semiconductor device is markedly stabilized.

An incidental advantage of the above described fabrication techniques for the MOS structure is that the polarity of the discharge voltage applied across the metal electrode and the silicon crystal may be reversed from the polarity ordinarily employed for a time interval prior to the formation stage of the tantalum oxide layer. By this procedure, the surface of the oxide layer that would otherwise be contaminated can be cleaned during this time interval by ion bombardment of the surface. Therefore, the occurrence of surface contamination in conventional practice due to exposure of the Si=$Si_2$ system to the atmosphere is eliminated, because contaminating gases in the atmosphere that may have been absorbed in the surface of the silicon dioxide layer are expelled therefrom.

Detailed description of preferred embodiment

Figure 1:
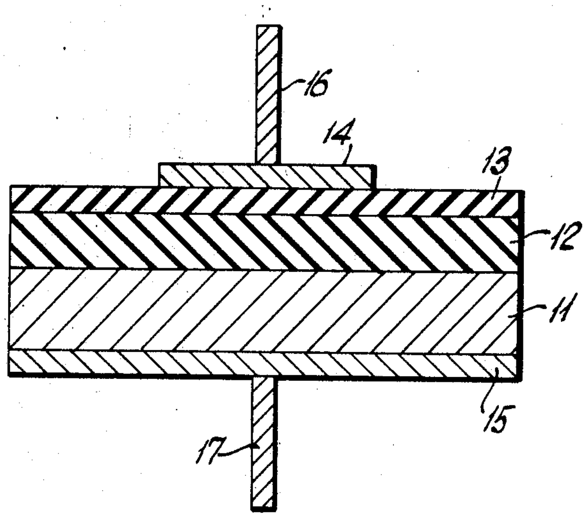
FIG. 1 is a diagrammatic cross-sectional view of an MOS diode made in accordance with this invention.

FIG. 1 illustrates a diagrammatic cross sectional view of an MOS diode made according to one preferred embodiment of the invention, which can be fabricated by a succession of steps carried out on a substrate in a chamber that is first evacuated and then provided with a highly purified oxygen gas atmosphere, with the pressure inside the chamber maintained at a predetermined value, for example, $10^{-2}$ Hg mm.

As a first step, one surface of a silicon substrate 11 is coated by thermal oxidation with a layer of $SiO_2$ having a thickness of the order of 2,000 angstroms. This coated substrate is next placed at or near an anode, made of aluminum, for example, and a glow discharge is then produced between this anode and the cathode, which is preferably made of tantalum, to form a tantalum oxide layer 13 having a thickness of the order of from 500 to 1,000 angstroms on the silicon dioxide layer 12 by reactive sputtering. This is followed by the formation of a metal electrode 14 by vacuum evaporation of aluminum on the tantalum oxide layer 13. An ohmic contact electrode 15 is then formed on the back surface, for instance, of the silicon substrate 11. The MOS diode structure is then completed by connecting metal leads 16 and 17 to the electrodes 14 and 15 respectively, by the thermo-compression or any other suitable method.

Now it has been publicly known that the degree of stability of the performance of MOS diodes with respect to the bias temperature treatment may be evaluated in terms of the amount of shift in the direction of the voltage axis that is produced between a capacitance=voltage characteristic curve plotted before the bias temperature treatment and one plotted after such treatment.

Figure 2:
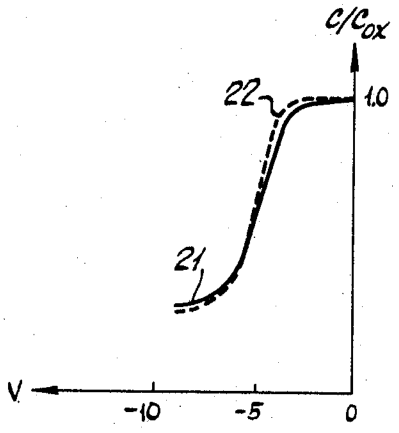
FIG. 2 is a graph showing curves of the capacitance-voltage characteristics of the MOS diode illustrated in FIG. 1 as measured both before and after the bias temperature treatment, respectively.

The graph of FIG. 2 depicts a variation of the MOS diode capacitance C normalized by the oxide layer capacitance $C_{oxide}$ (ordinate) as a function of DC voltage (abscissa) applied across the two leads 16 and 17. In conducting the measurements for the amount of shift for several samples of the MOS diode structure of the type illustrated in FIG. 1, a DC voltage of 10 volts was applied across the leads 16 and 17 so that the polarities of the metal electrode 14 and the silicon substrate 11 were positive and negative respectively, and under this condition the bias temperature treatment was performed at a temperature of 200 degrees centigrade for one hour.

The results of the measurements of the characteristics of the diode samples, before and after the bias temperature treatment, indicated a substantial amount of shift between the characteristic curves 21 and 22 as plotted before before and after the treatment respectively, and this is evidenced by the graph of FIG. 2.

Figure 3:
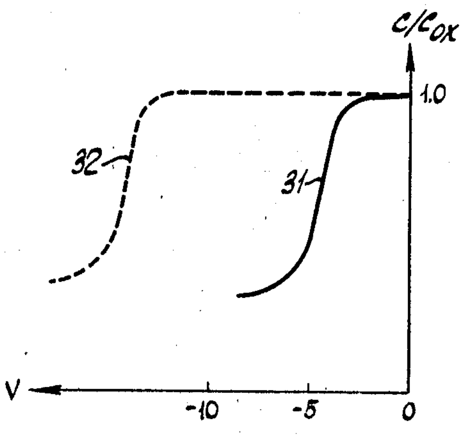
FIG. 3 is a graph showing the curves of the capacitance-voltage characteristics of a conventional MOS diode.

FIG. 3 is a similar plot of the capacitance-voltage characteristics of several samples of a conventional MOS diode structure, which lacks the tantalum oxide layer provided in accordance with this invention. In FIG. 3, whose coodinate axes are the same as for FIG. 2, it is seen that the characteristic curve 31 plotted before the bias temperature treatment is shifted to the position of the characteristic curve 32 plotted after the treatment, by an amount of more than 10 volts in the negative direction of the voltage axis. From a comparison of FIGS. 2 and 3, is will be clear that the performance of MOS semiconductor devices modified according to the principles of this invention become markedly stabilized in performance by interposing the tatalum oxide layer between the metal electrode 14 and the silicon dioxide layer 12.

While the principles of this invention have been described above in connection with an MOS diode structure as a preferred embodiment, it will be appreciated that the invention is applicable to MOS transistor structures and other semiconductor devices to provide improved performance stability in connection with the bias temperature treatment.

Although it has been mentioned in the foregoing description of the preferred embodiment that the silicon dioxide layer is formed by thermal oxidation of the silicon single crystal, any other suitable technique such as evaporation or growth from a vapor phase of silicon dioxide may be employed for formation of the layer.

It will be further apparent than any other known semiconductor such as germanium or the III–V compound semiconductors may be substituted for silicon as the semiconductor substrate and that any insulating material other than silicon dioxide such as is normally used in conventional MOS structures may be used for the oxide layer.

While the foregoing description sets forth the principles of the invention in connection with specific apparatus, it is to be understood that the description is made only by way of example and not as a limitation of the scope of the invention as set forth in the objects thereof and in the accompanying claim.

What is claimed is:

1. The method of making an improved semiconductor device which comprises the steps of:

placing a semiconductor substrate in a chamber, providing a highly purified oxygen atmosphere in said chamber, forming an oxide insulation layer on a surface of said substrate, forming a thin layer of tantalum oxide on said oxide insulation layer by reaction sputtering in a glow discharged environment, and providing a metal electrode on said tantalum oxide layer.

References Cited

UNITED STATES PATENTS

| | | | |
|---|---|---|---|
| 3,398,067 | 8/1968 | Raffalovich | 29—570 |
| 3,406,043 | 10/1968 | Balde | 29—577 |
| 3,424,956 | 1/1969 | Sato et al. | 317—234 |
| 3,426,422 | 2/1969 | Deac | 29—590 |
| 3,430,335 | 3/1969 | Gee | 29—590 |
| 3,432,918 | 3/1969 | Riley et al. | 29—570 |

PAUL M. COHEN, Primary Examiner

U.S. Cl. X.R.

29—25.42; 317—258